United States Patent
Okabe et al.

(10) Patent No.: US 6,390,145 B1
(45) Date of Patent: May 21, 2002

(54) CONTAINER AND METHOD FOR SEALING THE CONTAINER

(75) Inventors: Tsutomu Okabe; Toshihiko Miyajima; Hiroshi Igarashi, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/494,405

(22) Filed: Jan. 31, 2000

(30) Foreign Application Priority Data

Jun. 23, 1999 (JP) ............................................ 11-176592

(51) Int. Cl.$^7$ ................................................ B65D 85/30
(52) U.S. Cl. ............................... 141/1; 141/65; 141/98; 220/231; 220/232; 220/378; 414/939
(58) Field of Search .................................. 220/378, 231, 220/232, 239, 240; 29/428; 141/1, 65, 66, 98; 414/292, 935, 939, 940; 206/710, 711

(56) References Cited

U.S. PATENT DOCUMENTS

| | | | |
|---|---|---|---|
| 3,694,962 A | * | 10/1972 | McDonald et al. |
| 5,139,459 A | | 8/1992 | Takahashi et al. |
| 5,255,783 A | * | 10/1993 | Goodman et al. |
| 5,295,522 A | * | 3/1994 | DeAngelis et al. |
| 5,364,219 A | | 11/1994 | Takahashi et al. |
| 5,575,081 A | * | 11/1996 | Ludwig |
| 5,611,452 A | * | 3/1997 | Bonora et al. |
| 5,755,332 A | * | 5/1998 | Holliday et al. |

FOREIGN PATENT DOCUMENTS

| | | |
|---|---|---|
| JP | 63-28047 | 2/1988 |
| JP | 2137951 | 11/1994 |
| JP | 2525284 | 5/1996 |
| JP | 9-246351 | 9/1997 |
| JP | 2722306 | 11/1997 |
| JP | 10-56050 | 2/1998 |
| JP | 2757102 | 3/1998 |
| JP | 2850279 | 11/1998 |
| JP | 10-321695 | 12/1998 |
| JP | 10-321696 | 12/1998 |

* cited by examiner

Primary Examiner—Nathan J. Newhouse
(74) Attorney, Agent, or Firm—Oblon, Spivak, McClelland, Maier & Neustadt, P.C.

(57) ABSTRACT

A clean box has a container including a container body opened at one surface and a lid for closing the opening of the container body. An annular groove is formed in at least one of the container body and the lid so as to surround the opening. An elastic seal member is disposed within the annular groove along its whole length. A cross-section in a width direction of the elastic seal member has relatively thick end portions and a relatively thin intermediate portion in its dimension in a depth direction of the annular groove. Thus, when the lid closes the opening of the container body, an annular suction space is defined along the intermediate portion of the seal member. Also, the suction space is sealed by elastic deformation of the both end portions of the seal member between the container body and the lid. Further, the clean box has an intake/exhaust port mechanism for evacuation/release of the suction space from the outside.

6 Claims, 3 Drawing Sheets

CONTAINER AND METHOD FOR SEALING THE CONTAINER

BACKGROUND OF THE INVENTION

1. Field of the Invention

The present invention relates to a method for sealing a container which is suitable for a clean box for transferring and reserving a variety of articles to be processed such as semiconductor wafers in a process for manufacturing a semiconductor, an electronic parts related product, an optical disc or the like and a container according to this method, particularly, a clean box.

2. Related Background Art

Recently, in a manufacturing process which requires a high level clean environment such as a semiconductor device manufacturing process or the like, a method such as a mini-environment or a local clean space where an entire factory is not kept clean but only the ambient environment is kept under a clean condition has been adopted. In brief, only the interior of the respective processing apparatus is kept clean, and the transfer and reservation of the articles to be processed between the respective processing apparatus (clean apparatus) are performed by using containers whose interior is kept clean (hereinafter referred to as clean boxes).

In general, the clean box has a substantially rectangular box body opened at one surface and a detachable lid for sealing the box body. In order to keep the interior of the box clean, a mechanism for sealing a gap between the lid and the body is provided so as to prevent dusts or the like from entering the interior from the outside. Conventionally, an elastic seal member such as an O-ring is mounted on the box body or the lid so as to surround an opening of the box body under the condition that the lid is closed, and the seal member is deformed by a mechanical means such as a latch mechanism that works between the box body and the lid to thereby obtain a seal force. However, there is a limit to the seal force that may be obtained by such a mechanism. For example, the conventional clean box used in the manufacturing process of semiconductor devices suffers from a problem that the seal would be insufficient so that the replacement condition could not be maintained for a long period in the seal system of the conventional clean box although the interior of the box is replaced by non-oxidized gas in order to prevent the natural oxidation of the semiconductor wafers received in the box in some case.

In contrast, a system for sealing a gap between the box body and the lid by a vacuum suction is disclosed in the commonly assigned Japanese Patent Application Laid-Open No. 10-321696. This system will be described in brief. FIGS. 1 and 2 show a vacuum suction type clean box having an opening at its bottom. FIG. 1 is a side elevational cross-sectional view of the clean box, and FIG. 2 is a plan view of the lid.

As shown in FIG. 1, the clean box 100 is composed of a substantially rectangular box body 101 which opens at one of the side surface (the bottom surface in the example of FIG. 1) and a lid 102 for closing the opening of the box body 101. A shelf-like carrier 103 for holding semiconductor wafers to be received in the box at an equal distance is fixed on the lid 102 in the example shown in FIG. 1. An annular groove 110 for vacuum suction is formed in a circumferential portion of a surface (upper surface), facing the box body, of the lid 102. As shown in FIG. 2, O-rings are mounted as the respective elastic seal members along the annular groove 110 inside and the outside of the annular groove 110. In the condition shown in FIG. 2 in which the lid 102 closes the opening of the clean box body 101, the inner space of the annular groove 110 is closed at its upper portion by the flange portion 101a of the box body, i.e., the suction space formed by the flange portion 101a of the box body and the annular groove 110 is vacuum sucked so that the lid 102 is sucked to the box body 101. The vacuum exhaust is performed from the back surface of the lid by a means (not shown) through the air passage 112 provided in communication with the annular groove 110.

Thus, the annular groove is evacuated so that the lid 102 is sucked to the flange portion 101a of the clean box 101 to thereby obtain tight seal.

The seal system of the lid for the clean box according to the vacuum suction is very strong and superior in seal force. However, in the above-described conventional system, since the respective seal members (O-rings) are provided for inside and outside of the annular groove, respectively for sealing the vacuum suction space of the annular groove, a rather great width is required for the seal portion. Accordingly, the flange portion 101a requires a width that is large to some extent for the box body 101. This may obstruct the reduction in size of the clean box.

Also, in manufacturing the clean box, it is necessary to machine two grooves for the seal members (O-rings) in addition to the groove for the vacuum suction. There is also a problem in that the number of the manufacture steps is large. This should be resolved.

SUMMARY OF THE INVENTION

In view of the foregoing defects, an object of the present invention is to provide a sealing method with simple machining for sealing a cover of a container such as a clean box while utilizing a vacuum suction system and making it possible to limit the sealing arrangement in a smaller area, and to provide a container, particularly, a clean box, manufactured with employing such sealing method.

According to the present invention, a container (preferably, clean box) includes a container body opened at one surface and a lid for closing the opening of the container body. An annular groove is formed in at least one of the container body and the lid so as to surround the opening. An elastic seal member is disposed within the annular groove along the whole length thereof. A cross-section in a width direction of the elastic seal member has both end portions whose dimension in a depth direction of the annular groove is relatively thick and an intermediate portion that is relatively thin. Thus, when the lid closes the opening of the container body, an annular suction space is defined along the intermediate portion of the seal member. Also, the suction space is sealed by elastic deformation of the both end portions of the seal member between the container body and the lid. Further, the container has an intake/exhaust port for evacuation/release of the suction space from the outside.

Thus, the characterized shape elastic seal member is disposed within the annular groove per se that may provide the suction space whereby the seal may be possible in the vacuum suction fashion while it is unnecessary to provide an additional groove for the seal member. Accordingly, it is possible to impart an effective seal that is high in sealability in the narrow width.

In an embodiment of the present invention, the annular suction space is divided into two spaces in the depth direction of the annular groove by the intermediate portion of the seal member, the intermediate portion of the seal member is provided with at least one through hole, and the two divided spaces are in communication with each other through the through hole. More preferably, a plurality of through holes may be formed substantially at an equal interval along the annular shape of the seal member.

There is provided a method for sealing a container according to the invention, the container comprising a container body opened at one surface and a lid for closing the opening of the container body, wherein an annular groove is formed in one of the container body and the lid so as to surround the opening, and an elastic seal member is disposed within the annular groove along the whole length thereof, a cross-section in a width direction of the elastic seal member having relatively thick end portions and a relatively thin intermediate portion in its dimension in a depth direction of the annular groove, whereby when the lid closes the opening of the container body, an annular suction space is defined along the intermediate portion of the seal member, and the suction space is sealed by elastic deformation of the both end portions the seal member between the container body and the lid. The method includes the step of sealing the container by vacuum exhausting the suction space.

DESCRIPTION OF THE PREFERRED EMBODIMENTS

Figure 1:
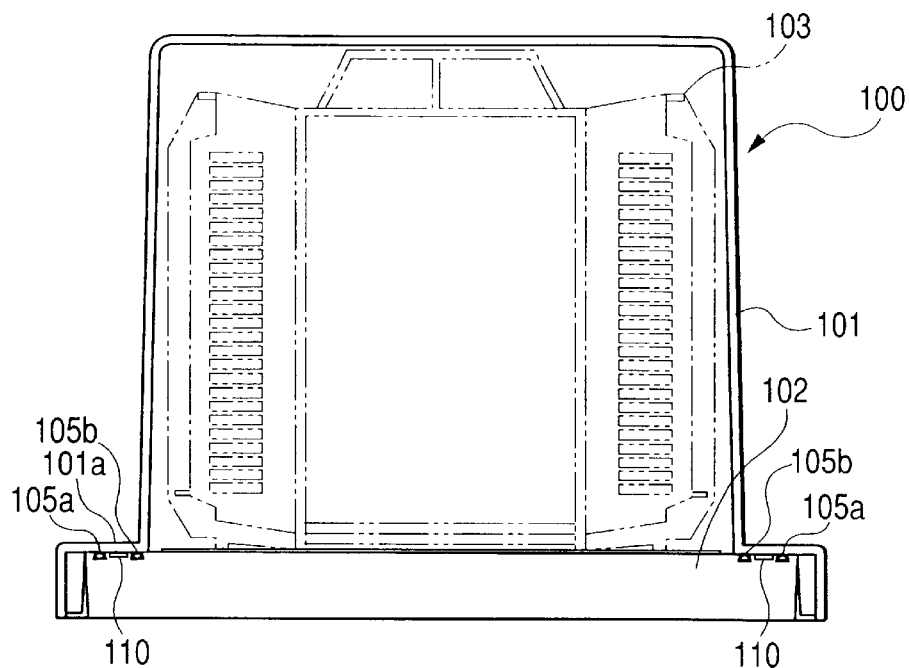
FIG. 1 is a side elevational cross-sectional view of a clean box having a seal portion in a conventional vacuum suction system.
Figure 2:
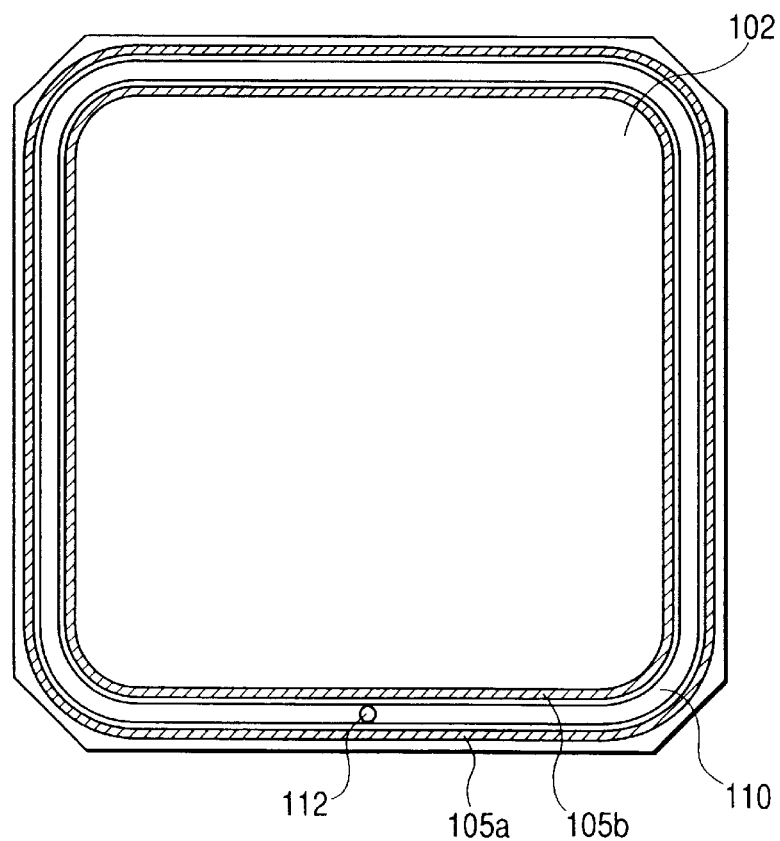
FIG. 2 is a top plan view of a lid of the conventional clean box shown in FIG. 1.
Figure 3:
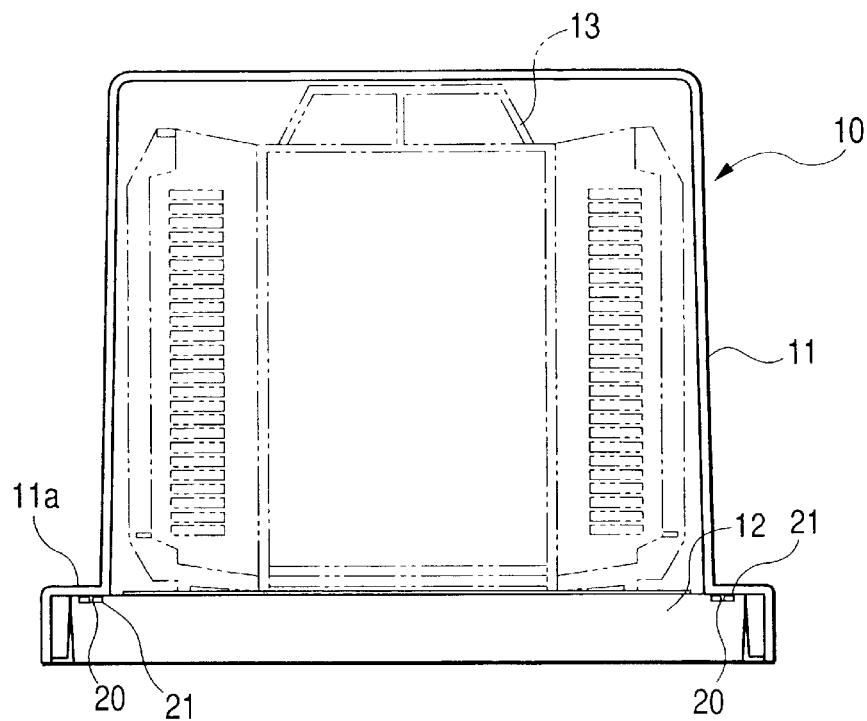
FIG. 3 is a side elevational cross-sectional view of a clean box in accordance with an embodiment of the present invention.
Figure 4:
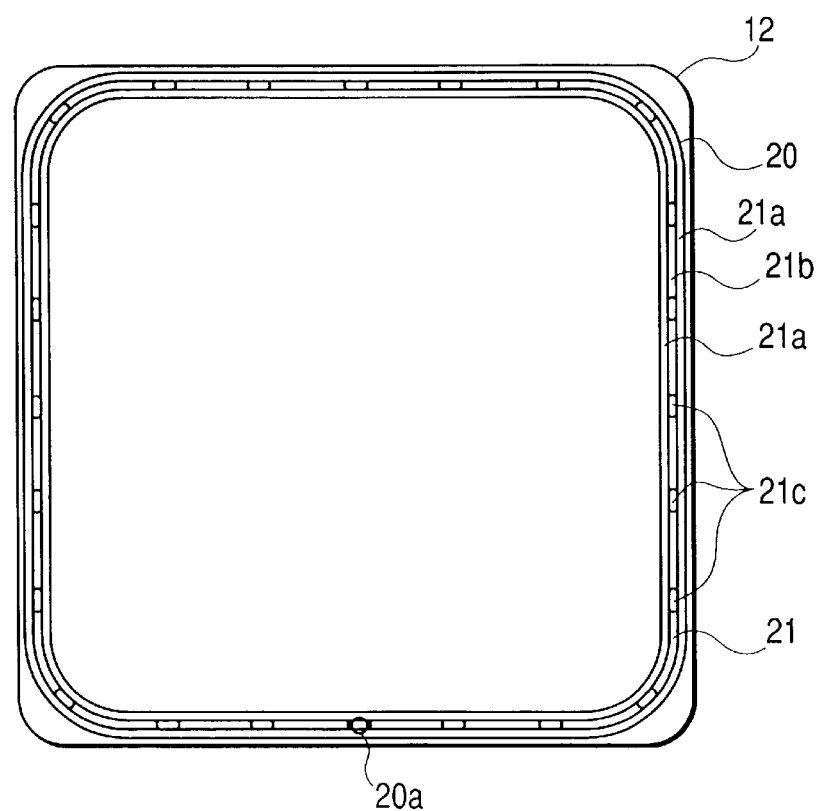
FIG. 4 is a top plan view of the lid of the clean box shown in FIG. 3.

A clean box used in transfer and reservation of a semiconductor wafer in a manufacturing process for semiconductor devices will now be described as an embodiment of the present invention with reference to FIGS. 3 to 5. FIG. 3 is a side elevational cross-sectional view of the clean box. The clean box has a seal portion according to the present invention. The clean box 10 is composed of a substantially square-shaped clean box body 11 opened at one side (a bottom surface in this example) and a lid 12 for closing an opening of the clean box body 11. A flange portion 11a expanding along a bottom portion opening of the clean box body is formed.

A shelf-like carrier 13 for holding at an equal interval semiconductor wafers to be received in the clean box is fixed onto the lid 12. As shown in FIGS. 3 and 4, an annular groove 20 is formed for vacuum suction along a circumferential portion of a surface, facing the clean box body, of the lid 12. The annular groove is formed at a position that is to be in direct contact with the flange portion 11a of the clean box body under the condition that the clean box body 11 is closed by the lid 12 so that the annular groove may surround the opening of the clean box. An annular elastic seal member 21 having a special cross-sectional shape is embedded along the annular shape of the annular groove 20. The seal member 21 is made of elastic material such as rubber.

A seal mechanism for the clean box will now be described in detail with reference to FIG. 5 which is a side elevational view showing a mechanism (to be described later) for vacuum exhausting the annular groove and a cross-section of a primary part around the annular groove 20 of the clean box. The annular groove 20 formed in the lid 12 has a substantially rectangular cross-section. A seal member 21 fitted in the annular groove 20 has a dumbbell-shaped cross-section. Namely, the cross-section of the seal member is formed so that a thickness in a depth direction (vertical direction of FIG. 5) of the annular groove is increased at both ends in the width direction of the annular groove (horizontal direction of FIG. 5) and an intermediate portion 21b connecting thick portions 21a at both ends is thinned. Through holes 21c are formed intermittently at equal intervals along the circumferential direction of the seal member (see FIG. 4). As is apparent from FIG. 4, in the embodiment, twenty-four through holes 21c are formed along the circumferential direction. FIG. 5 is a cross-sectional view at the position where the through hole 21c is present. In a cross-section (not shown) at the position where the through hole 21c is not present, the intermediate thin portion 21b connects the thick portions 21a continuously without being interrupted by the through hole 21c. The seal member 21 is bonded to a bottom surface of the annular groove 20 at its lower portion.

Under the condition that the lid 12 is not mounted on the clean box body 11, the thick portions 21a at both ends of the seal member 21 have such a thickness that the thick portions project to some extent beyond a plane of a surface 12a on which the annular groove 20 of the lid 12 is formed. When the lid 12 is to be mounted on the clean box body 11, the thick portions 21a at both ends of the seal member are depressed and elastically deformed by the flange portion 11a of the clean box body down to the plane of the surface 12a to thereby impart the seal force.

Figure 5:
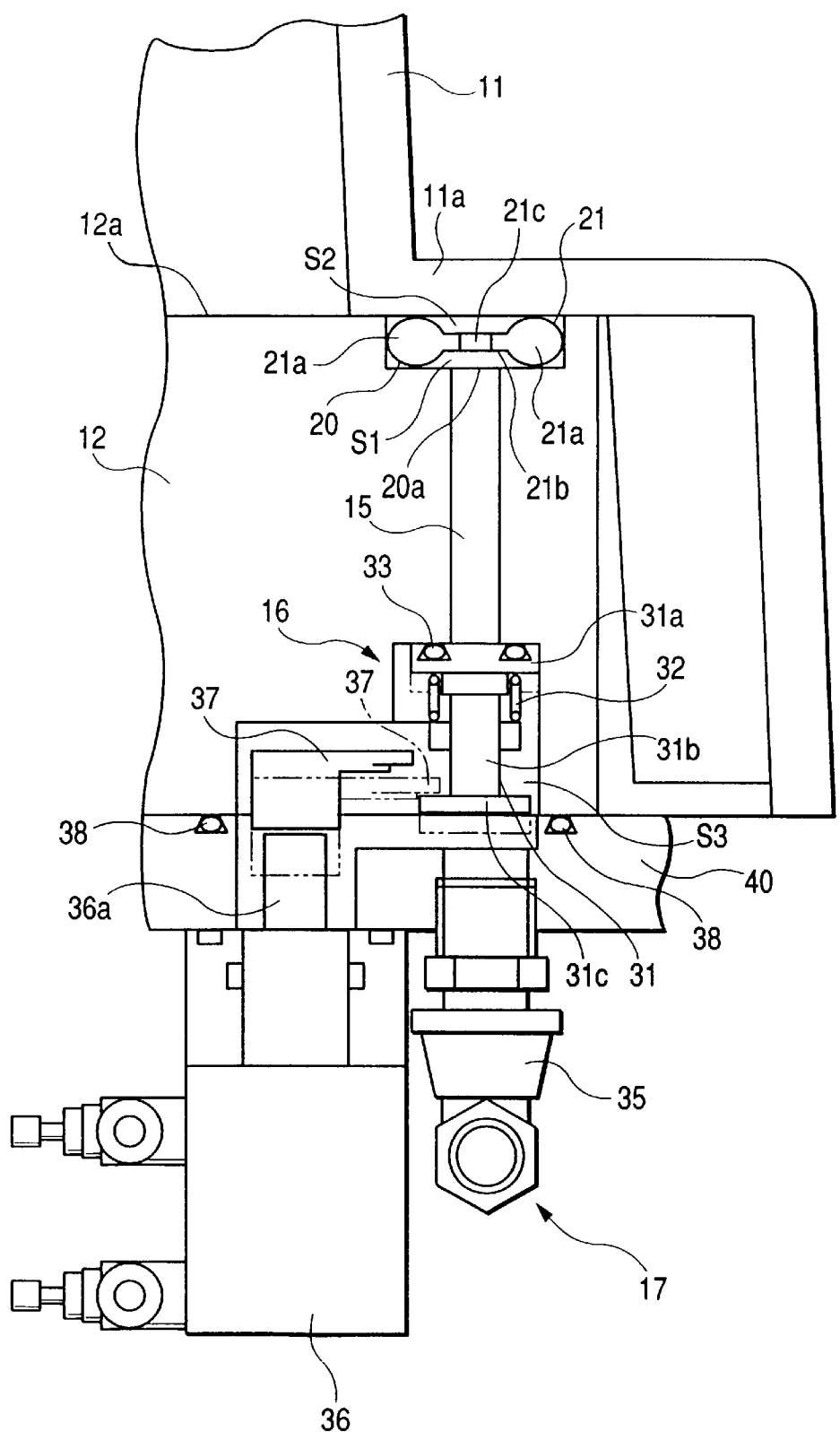
FIG. 5 is a side elevational view showing a vacuum exhaust means as an external arrangement and a detail of the vacuum suction seal portion of the clean box shown in FIG. 3 (the clean box portion being shown in cross-section).

As shown in FIG. 5, under the condition that the lid 12 seals the clean box body 11, the opening portion at the upper portion of the annular groove 20 is closed by the flange portion 11a of the clean box body. Under this condition, a space S2 is formed between the flange portion 11a of the clean box body and the upper portion of the seal member 21, and a space S1 is defined between the bottom surface of the annular groove 20 and the lower portion of the seal member 21. As viewed from above, these spaces S1 and S2 form annular spaces substantially defined along the above-described intermediate portion 21b of the seal member to be spaces for vacuum suction. The spaces S1 and S2 are in communication with each other through the through holes 21c provided intermittently in the intermediate thin portion 21b of the seal member 21.

An intake/exhaust port 20a is formed at a certain position of the bottom surface of the annular groove 20 for evacuation/release of the interior of the annular groove, i.e., the spaces S1 and S2. The intake/exhaust port 20a is in communication with a vacuum port 16 provided in the lower surface (outer surface) of the lid 12 through the gas passage 15 provided in the interior of the lid 12. The vacuum port 16 cooperates with an evacuation mechanism 17.

A mechanism for evacuating the interior of the annular groove 20 will now be described with reference to FIG. 5. The vacuum port 16 of the lid 12 and the evacuation mechanism 17 related thereto and located outside are shown in FIG. 5. Normally, the evacuation mechanism is formed as a part of a load port for opening/closing the clean box, which picks up the semiconductor wafers within the clean box and loading them onto the semiconductor manufacture apparatus.

As shown in FIG. 5, the vacuum port 16 in communication with the annular groove 20 through the intake/exhaust port 20a and the gas passage 15 is provided in the interior of the lid 12. The vacuum port includes a valve body 31 provided movably in the vertical direction. The valve body 31 is composed of a closure flange portion 31a for closing the passage 15 that is in communication with the annular groove 20, the opposite engagement flange 31c and a cylindrical portion 31b for connecting the flange portions 31a and 31c. The lower surface of the closure flange portion 31a (on the opposite side to the surface facing the passage 15) is biased upwardly by a coil spring 32. Namely, the valve body 31 is generally depressed in a direction in which the valve body 31 closes the passage 15, and gas-tightly seal the passage 15 by the closure flange portion 31a. An O-ring 33 is provided on an upper surface of the closure flange portion 31a for keeping the gas-tightness.

The evacuation mechanism 17 for evacuation/release of the annular groove 20 of the clean box from the outside has an actuator (air cylinder) 36 for releasing the closure of the passage 15 by the above-described valve body 31. An air pressure allows a cylinder portion 36a of the actuator 36 to be pivotally movable around the shaft and longitudinally movable in the linear direction. A hook arm 37 is provided at an upper portion of the cylinder portion 36a. The air cylinder is operated to be positioned at a position indicated by two-dot-and-dash lines in FIG. 5 so that the hook arm may be engaged with the valve body engagement flange portion 31c. Under this condition, when the actuator 36 is operated in the linear direction to draw down the arm 37, the hook arm 37 is engaged with the engagement flange portion 31c so that the valve body 31 as a whole is drawn against the expanding force of the spring 32. Thus, the closure of the passage 15 by the closure flange 31a is released so that the space S1 of the annular groove 20 is in communication with a space S3 of the vacuum port via the passage 15. Thus, it is possible to evacuate the annular groove 20 (spaces S1 and S2) by the passage 35 in communication with the space S3, or inversely to release the vacuum by introducing the gas into the annular groove 20 kept under the vacuum condition.

An O-ring 38 is provided to surround the vacuum port 16 at an upper surface of an upper plate 40 of the evacuation mechanism 17, serving to seal the space between the lid 12 and the surface.

The structure of the vacuum port 16 and the evacuation mechanism 17 has been described above. However, as a matter of fact, in the lid 12 of the clean box, the interior of the annular groove 20 and the passage 15 is kept evacuated. Accordingly, the closure flange 31a of the valve body 31 is strongly pressed on the side of the passage 15 by the pressure difference between the inside and the outside, i.e., the pressure difference between the space on the side of the passage 15 and the space S3. Without any countermeasure, it is therefore difficult to move the valve body 31 downwardly by the hook arm 37.

Accordingly, in order to open the lid 12 of the clean box 11, the following process is taken. First of all, the space S3 is evacuated through the passage 35 to obviate or moderate the pressure difference through the closure flange 31a. Thus, it is possible to release the closure of the passage 15 by the valve body 31 (closure flange 31a) by means of the hook arm in the above-described steps. After the release of the closure of the passage 15, the space is released to the atmosphere through the passage 35 or the gas is introduced through the passage 35, the space S3, the passage 15 and the annular groove 20 (spaces S1 and S2) are kept equal to the atmospheric pressure. Thus, the vacuum suction seal between the lid 12 and the clean box body 11 is released to thereby make it possible to open the lid 12.

Inversely, the process for evacuating the annular groove 20 and sucking the lid 12 and the clean box body 11 is as follows. First of all, under the condition that the closure flange 31a is kept open, the passage 35 is connected to the vacuum source, so that the annular groove 20 is evacuated through the space S3 and the passage 15. Subsequently, the actuator 36 is operated to release the engagement between the hook arm and the engagement flange 31c. As a result, the valve body 31 is moved upwardly by the force of the spring 32 so that the closure flange 31a closes the passage 15. Thereafter, if the passage 35 is released to the atmosphere, the passage 15 is kept under the vacuum condition and the space S3 is kept at the atmospheric pressure so that the closure flange 31a firmly closes the passage 15 by the pressure difference between the inside and the outside.

Thus, the spaces S1 and S2 within the annular groove 20 are evacuated and gas exhausted through the intake/exhaust port opened to the annular groove 20 so that the lid 12 is vacuum sucked to the clean box body 11. Thus, the interface between the lid 12 and the clean box body 11 is firmly sealed. Actually, it was confirmed that the seal force was much stronger than that obtained by the conventional seal system in which a usual O-ring and a mechanical lock means are used in combination.

The invention has been thus far described in accordance with its embodiment. However, it is apparent that the invention is not limited to the detail of the embodiment. For instance, the intake/exhaust port for vacuum exhausting the spaces S1 and S2 may be provided on the side of the clean box body. More specifically, the intake/exhaust port may be provided at a position facing the annular groove 20 of the flange portion, i.e., a position in communication with the space S2. In this case, the intake/exhaust port performs the vacuum exhaust on the side of the clean box body, for example, through the vacuum port provided in the top surface of the flange portion 11a by the vacuum exhaust means located outside.

Also, in the foregoing embodiment, the annular groove 20 and the seal member 21 are formed in the lid 12 but they may be provided on the side of the clean box body, i.e., at that position of the flange portion 11a of the clean box body which faces the lid 12. Also in this case, the intake/exhaust port and the gas passage for evacuating the annular groove may be provided on the lid side or the clean box body side.

Also, the clean box according to the foregoing embodiment is of the type having the opening in the lower surface thereof. However, the present invention is not limited thereto or thereby. For example, of course, the present invention may be applied to a clean box that of the type having an opening on the side wall.

Also, in the foregoing embodiment, the cross-section of the seal member is shaped in an dumbbell. The present invention is not limited thereto or thereby. Any other cross-section may be adapted as long as both end portions in the width direction are thick, and the intermediate portion therebetween is thin so that the suction space may be formed within the annular groove. For example, a cross-section may be formed in which the intermediate thin portion of the seal member is to be brought into intimate contact with the bottom surface of the annular groove (that is, the cross-section of the seal member is of substantially U-shape). Namely, the space S1 in the foregoing embodiment is dispensed with and only the space S2 is formed. In this case, if the intake/exhaust port opened to the inner space of the annular groove is provided on the clean box body side and the intake/exhaust for the annular groove is performed from the clean box body side, the through holes 21c provided in the intermediate thin portion 21b of the seal member 21 in the embodiment may be dispensed with. In the case where the intake/exhaust port is provided on the lid side, the through hole may be provided at only one position of the intake/exhaust port.

In the seal system for the container in accordance with the present invention, the cross-section of the seal member has an intermediate thin portion relative to both end portions in the width direction so that the seal member may be disposed within the annular groove for the vacuum suction. Accordingly, it is unnecessary to machine a discrete groove for the seal member to thereby facilitate the manufacture. In addition, since the installation area for the vacuum suction portion may be made compact, it is possible to make compact the container.

Furthermore, the advantage of the seal system by the vacuum suction may be maintained, and the seal effect that is much stronger than that of the mechanical lock system may be ensured. The seal system is excellent particularly as the clean box since it is possible to prevent not only dust but also various kinds of organic or inorganic substance which causes chemical contamination from entering. Also, in the case where the internal air is replaced by the gas such as non-oxidizing gas, it is possible to maintain the replacement condition for a long period of time.

What is claimed is:

1. A container comprising a container body opened at one surface and a lid for closing the opening of the container body, wherein an annular groove is formed in at least one of the container body and the lid so as to surround the opening, and an elastic seal member is disposed within the annular groove along the whole length thereof, a cross-section in a width direction of the elastic seal member having relatively thick end portions and a relatively thin intermediate portion in its dimension in a depth direction of the annular groove, whereby when the lid closes the opening of the container body, an annular suction space is defined along the intermediate portion the seal member, and the suction space is sealed by elastic deformation of the both end portions of the seal member between the container body and the lid, and the container has an intake/exhaust port for performing vacuum exhaust/vacuum release of the suction space from the outside.

2. The container according to claim 1, wherein the annular suction space is divided into two spaces in the depth direction of the annular groove by the intermediate portion of the seal member, the intermediate portion of the seal member is provided with at least one through hole, and the two divided spaces are in communication with each other through the through hole.

3. The container according to claim 2, wherein a plurality of through holes are formed substantially at an equal interval along the annular shape of the seal member.

4. The container according to claim 1, wherein said container is a clean box.

5. A method for sealing a container, said container comprising a container body opened at one surface and a lid for closing the opening of the container body, wherein an annular groove is formed in at least one of the container body and the lid so as to surround the opening, and an elastic seal member is disposed within the annular groove along the whole length thereof, a cross-section in a width direction of the elastic seal member having relatively thick end portions and a relatively thin intermediate portion in its dimension in a depth direction of the annular groove, whereby when the lid closes the opening of the container body, an annular suction space is defined along the intermediate portion of the seal member, and the suction space is sealed by elastic deformation of the both end portions of the seal member between the container body and the lid, said method comprising the step of sealing the container by vacuum exhausting the suction space.

6. The method for sealing a container according to claim 5, wherein said container is a clean box.

* * * * *